United States Patent [19]

Bergfelt et al.

[11] 4,222,345
[45] Sep. 16, 1980

[54] VACUUM COATING APPARATUS WITH ROTARY MOTION ASSEMBLY

[75] Inventors: Nils H. Bergfelt; Richard I. Seddon, both of Santa Rosa, Calif.

[73] Assignee: Optical Coating Laboratory, Inc., Santa Rosa, Calif.

[21] Appl. No.: 965,167

[22] Filed: Nov. 30, 1978

[51] Int. Cl.² ............................ B44D 1/34; C23F 1/34
[52] U.S. Cl. ...................................... 118/720; 118/50; 118/504; 118/730; 118/53; 269/57; 427/70; 427/91; 427/109; 427/124; 427/251; 427/255.5
[58] Field of Search ...................... 118/49, 52, 53, 48, 118/50, 49.1, 49.5, 301, 504, 720, 730; 269/57; 427/251, 50, 69, 70, 78, 91, 99, 109, 124, 166, 167, 248

[56] References Cited

U.S. PATENT DOCUMENTS

| | | | |
|---|---|---|---|
| 3,312,190 | 4/1967 | Bradshaw | 118/49.1 |
| 3,352,282 | 11/1967 | Schweitzer | 118/49 |
| 3,511,212 | 5/1970 | Burns | 118/49 |
| 3,735,728 | 5/1973 | Krumme et al. | 118/49 |
| 3,777,703 | 12/1973 | Gillie | 118/49 |
| 3,853,091 | 12/1974 | Christenson et al. | 118/720 |
| 3,991,707 | 11/1976 | Thelen et al. | 118/49 X |

Primary Examiner—Edward C. Kimlin
Attorney, Agent, or Firm—Flehr, Hohbach, Test, Albritton & Herbert

[57] ABSTRACT

Coating apparatus having a vacuum chamber and a rotary motion assembly rotatably mounted in the vacuum chamber. Drive means is carried by the vacuum chamber for rotating the rotary motion assembly on an axis. At least one coating source is disposed within the chamber and is generally coincident with the axis of rotation for the rotary motion assembly. A mask structure is mounted in the chamber for rotational movement about an axis which is generally coincident with the axis of rotation of the rotary motion assembly. Additional drive means is provided for rotating the mask structure as the rotary motion assembly is rotated.

10 Claims, 3 Drawing Figures

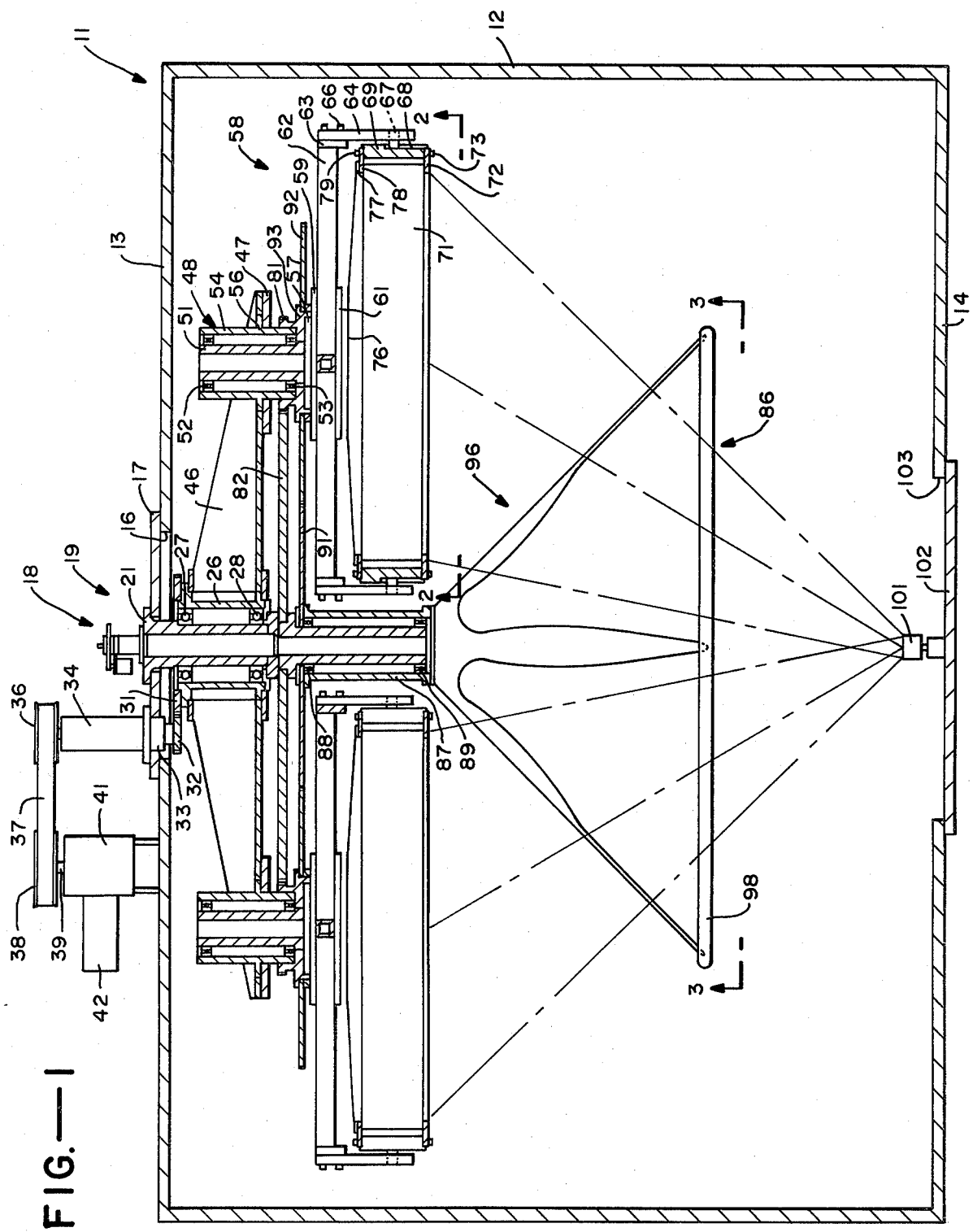

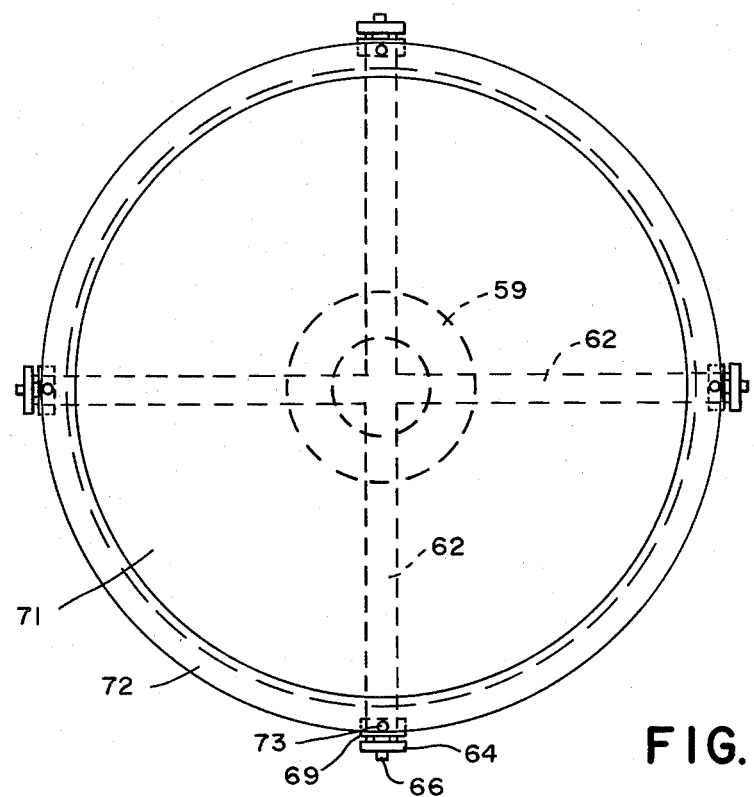
FIG.—2
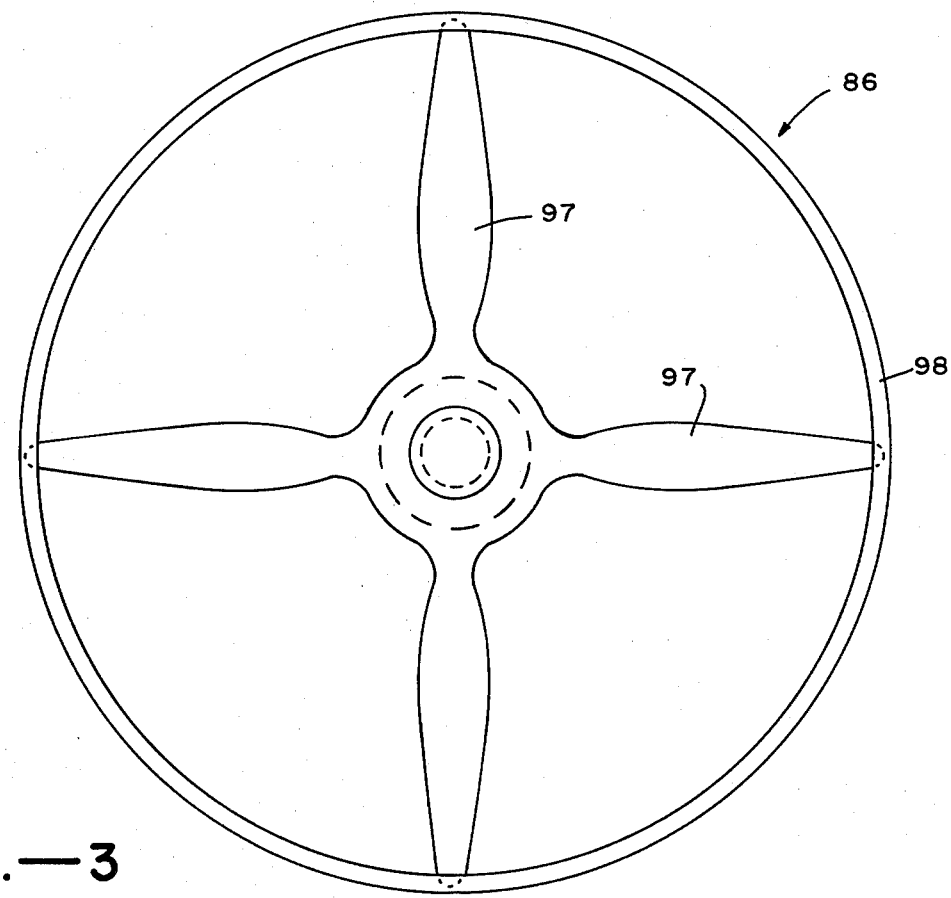
FIG.—3

VACUUM COATING APPARATUS WITH ROTARY MOTION ASSEMBLY

BACKGROUND OF THE INVENTION

Coating machines having capabilities for double rotation for coating the substrates are disclosed in U.S. Pat. Nos. 3,128,205 and 3,858,547. However, it has been found that such machines and apparatus are unsatisfactory when it is desired to coat large heavy substrates. They have also been found to be unsatisfactory when it is desired to coat such large heavy substrates with great uniformity. There is, therefore, need for a new and improved coating apparatus and method which overcomes the above named disadvantages.

SUMMARY OF THE INVENTION AND OBJECTS

The coating apparatus consists of a vacuum chamber. A rotary motion assembly is rotatably mounted in the vacuum chamber. Means is carried by the vacuum chamber for rotating the rotary motion assembly. The rotary motion assembly includes a plurality of arms, a spindle assembly carried by each of the arms and means for rotating the spindle assembly on each arm as the rotary motion assembly is rotated. At least one coating source is disposed within the chamber generally coincident with the axis of rotation for the rotary motion assembly. A mask structure is mounted within the chamber for rotational movement about an axis which is generally coincident with the axis of rotation for the rotary motion assembly. Means is provided for rotating the mask structure as the rotary motion assembly is rotated.

In general, it is an object of the present invention to provide a coating apparatus and method which makes it possible to coat large and heavy substrates.

Another object of the invention is to provide an apparatus and method of the above character which makes it possible to coat large substrates with a great uniformity.

Another object of the invention is to provide a coating apparatus and method of the above character in which a particular masking structure is utilized.

Additional objects and features of the invention will appear from the following description in which the preferred embodiments are set forth in detail in conjunction with the accompanying drawing.

BRIEF DESCRIPTION OF THE DRAWING

FIG. 1 is a cross sectional view of a coating apparatus incorporating the present invention.

FIG. 2 is a bottom plan view looking along the line 2—2 of FIG. 1.

FIG. 3 is a bottom plan view looking along the line 3—3 of FIG. 1.

DESCRIPTION OF THE PREFERRED EMBODIMENT

The coating apparatus or machine of the present invention consists of a large coating chamber or housing 11 which can be of any suitable shape. Thus as shown in FIG. 1, it can consist of a cylindrical side wall 12 and generally planar and parallel top and bottom walls 13 and 14. The top wall 13 is provided with a centrally disposed opening 16 which is covered by a top plate 17. The top plate 17 carries a rotary motion assembly 18.

A chip changing assembly of the type described in U.S. Pat. No. 3,387,742 is mounted in the rotary motion assembly 18 and includes a cylindrical stationary spindle 21 which is carried by the top plate 17. The chip changing apparatus 19 is substantially identical to that described in U.S. Pat. No. 3,387,742 and therefore will not be described in detail.

The rotary motion assembly 18 includes a cylindrical housing 26 which is mounted for rotational movement about the cylindrical spindle 21 on an axis which is coincident with the axis of the chip changer assembly 19 by a pair of spaced bearing assemblies 27 and 28. A ring gear 31 is mounted in the upper extremity of the housing 26 and is driven by a spur gear 32. The spur gear 32 is carried by a shaft 33 which is rotatably mounted in a feedthrough fitting 34 mounted on the top plate 17. The shaft 33 is driven by pulley 36. The pulley 36 is driven by a speed reducer 51 which is powered by a DC motor 42.

The rotary motion assembly includes a plurality of arms or gussets 46 which extend radially from the cylindrical housing 26. The outer extremity of each of the arms 46 carries a circular plate 47 to which is secured an outrigger spindle assembly 48.

Each outrigger spindle assembly 48 consists of a centrally disposed hollow spindle 51 which is rotatably mounted by upper and lower ball bearing assemblies 52 and 53 carried by cylindrical housing 54. The housing 54 is provided with a flange 56 which is secured to the circular plate 47. The spindle 51 carries a mounting plate 57. The mounting plate 57 carries a cross arm assembly 58. The cross arm assembly 58 consists of upper and lower circular plates 59 and 61 which have secured between them a plurality of arms 62 as, for example, four tubular arms which are rectangular in cross section and which extend at 90° with respect to adjacent arms. A part 63 is secured to the outer extremities of the arms 62 by suitable means such as welding. A hanger 64 is secured to each of the parts 63 by suitable means such as cap screws 66. The hangers 64 depend downwardly and each is provided with a pin 67 which extends horizontally into a vertically extending slot 68. The slots 68 are open at their lower extremities and are provided in an annular member or ring 69 which is sized so as to be capable to carry large and heavy substrates. As can be seen from FIG. 1, a substrate 71 which is carried by the ring 69 has a size which is slightly less than that of the inner diameter of the ring 69 and is retained therein by a clamping ring 72 that is secured to the lower extremity of the annular member or ring 69 by screws 73.

Each of the cross arm assemblies 58 includes a circular back cover plate 76 which is slightly concave when viewing the same from the bottom side and which has its outer margin carried by a support ring 77. The support ring 77 rests upon another ring 78 that is secured to the annular member 69 by suitable means such as cap screws 79. A ring gear 81 is mounted upon the mounting plate 57 and surrounds the cylindrical housing 54 but is spaced therefrom. The ring gear 51 is driven by a stationary sun gear 82 that is mounted upon the central stem 21 which is secured to the top plate 17. Thus, it can be seen that as the rotary motion assembly 18 is rotated, the gear 81 will be rotated to cause rotation of the outrigger spindle assemblies 48 and the substrates 71 carried thereby.

A uniformity mask assembly 86 is provided. It is mounted upon a cylindrical hub 87 and is positioned so that it is concentric with the central stem 21. It is rotatably mounted upon the central stem 21 by ball bearing assemblies 88 and 89. A mask drive gear 91 is secured to the upper extremity of the hub 87. The mask drive gear 91 is driven by a mask planetary gear 92 which is mounted upon the hub 93 that carries the ring gear 81. Uniformity mask assembly 86 consists of a sheet metal structure 96 which is comprised of at least three and as shown in FIG. 3 consists of four arms 97 which extend downwardly and outwardly from the hub 87. The arms 97 are shaped in a predetermined manner which can be determined mathematically or empirically to obtain a very uniform coating on the lower surface of the substrates 71 carried by the outrigger spindle assemblies 48. The lower extremities of the arms 97 are secured by a lower ring 98 which serves to position the lower extremities of the arms 97. Uniformity mask assembly 86 is rotated about an axis which is coincident with the axis of rotaton for the outrigger spindle assembly 48 and overlies the centrally disposed source 101 of coating material. The source 101 is carried by a circular plate 102 which covers an opening 103 provided in the bottom wall 14 of the chamber housing 11.

It is well known to those skilled in the art that the evaporation of coating material from a source such as source 101 has generally a cosine distribution with the greater concentration in the center and a line perpendicular to the surface of the source. The configuration of each of the arms 97 is designed in such a manner so as to compensate for this greater concentration is certain areas of the evaporated material before it is deposited. As can be seen from FIG. 3, the arms 97 have curved side edges and have a configuration which is similar to a propeller blade. Thus, as shown in FIG. 3, the outermost lower extremities secured to the ring 98 form the tip which gradually broadens for approximately two-thirds of the length and then decreases in size towards the upper extremity or root of the same.

Operation of the coating apparatus incorporating the present invention and the method utilized may now be briefly described as follows. Let it be assumed that substrates 71 have been replaced in the cross arm assemblies 58 in a manner hereinbefore described. Let it also be assumed material is being evaporated by the source 101 and that the chamber 11 has been evacuated. Placing the motor 42 in operation causes rotation of the ring gear 31. The rotation of the ring gear 31 causes rotation of the rotary motion assembly 18 about an axis which is coincident with the central axis of the chamber 11 and of the chip changing assembly 19. This causes rotation of the arms 46 carrying the outrigger spindle assemblies 48. The outrigger spindle assemblies 48 which carry the cross arm assemblies 58 with the substrates mounted therein are rotated by the gears 81 in engagement with the large sun gear 82. At the time that the outrigger spindle assemblies 48 are being rotated, the masked drive gear 91 is rotated which, in turn, causes rotation of the uniformity mask assembly 86 about an axis which is coincident with the axis of the chip changer assembly 19. As can be seen from FIGS. 1 and 3, the uniformity mask assembly 86 generally overlies the source 101 and serves as a uniformity mask for controlling the evaporation of coating materials from the source 101 onto the lower surfaces of the substrates 71 carried by the cross arm assemblies 58.

From a coating apparatus of this type utilizing such a method it has been found that the surfaces of large and relatively heavy substrates can be coated with great uniformity. After the coating operation has been completed, the substrates 71 can be readily moved by removing the retaining rings 72 and thereafter removing the substrates 71. New substrates to be coated can be readily inserted and the retaining ring 72 replaced to hold the substrates in place.

What is claimed is:

1. In a coating apparatus for coating substrates, a vacuum chamber, a rotary motion assembly rotatably mounted in the chamber for rotation about an axis, means for rotating the rotary motion assembly, the rotary motion assembly including a plurality of arms, a spindle assembly rotatably carried by each of the arms for rotation about its own axis, each spindle assembly being adapted to carry at least one substrate, means for rotating the spindle assembly on each arm as the rotary motion assembly is rotated so that each spindle assembly is rotated in a plane about the axis of rotation for the rotary motion assembly and about its own axis of rotation, at least one coating source disposed within the chamber generally coincident with the axis of rotation for the rotary motion assembly, a uniformity mask assembly disposed between said source and said spindle assemblies and mounted for rotation about an axis which is generally coincident with the axis of rotation for the rotary motion assembly and in a plane generally parallel to the plane in which the spindle assemblies are rotated and means for rotating the uniformity mask assembly on said axis, said uniformity mask assembly being comprised of a plurality of spaced apart arms having a configuration to modify the vapor distribution from the source so that the average coating deposited on the surfaces of the substrates facing the source is substantially uniform over the surfaces.

2. A coating apparatus as in claim 1 wherein said arms depend outwardly and are disposed symmetrically about said source.

3. A coating apparatus as in claim 2 wherein said mask assembly includes a ring-like member secured to the lower extremities of the arms for maintaining the positions of the outer extremities of the arms.

4. A coating apparatus as in claim 3 wherein each of said arms has curved side edges.

5. A coating apparatus as in claim 1 wherein said means for rotating said mask assembly includes a gear driven by the rotation of said spindle assemblies carried by said rotary motion assembly.

6. A coating apparatus as in claim 5 wherein each of said spindle assemblies includes a cross bar assembly, an annular member supported by the cross bar assembly, said annular member being formed to receive a substrate to be coated and means carried by the annular member for retaining the substrate within the annular member so that there is provided a downwardly facing surface which is adapted to receive vapors from the source.

7. A coating apparatus as in claim 6 wherein said members in said cross arm assemblies are provided with the cooperative pin and slot means for interconnecting the same.

8. In a coating apparatus for coating large substrates, a vacuum chamber, a chip changer assembly centrally disposed in the chamber, a rotary motion assembly rotatably mounted for rotation about an axis coincident with the chip changer assembly, a rotary motion assembly including a plurality of radially extending arms and a spindle assembly carried by each of the arms, means for rotating the rotary motion assembly, means for causing rotation of the spindle assembly as the spindle assemblies are rotated about an axis coincident with the axis of the chip changer assembly, a cross arm assembly carried by each of the spindle assemblies, means carried by each cross arm assembly for carrying a relatively large substrate so that the surface to be coated faces downwardly, a uniformity mask assembly underlying the spindle assemblies carried by the arms and mounted for rotational movement coincident with the axis of the chip changer assembly, gearing means interconnecting the mask assembly and the spindle assembly so as the spindle assembly is rotated, the mask assembly is rotated, a source of vapor underlying the mask assembly in a position which is generally coincident with the axis of the chip changer so that the axis of rotation for the mask assembly is generally coincident with the source, said uniformity mask assembly being comprised of a plurality of spaced apart arms having a configuration to modify the vapor distribution from the source so that the average coating deposited on the surfaces of the substrates is substantially uniform over the surfaces.

9. A coating apparatus as in claim 8 wherein said arms are outwardly and downwardly extending and are symmetrically disposed.

10. A coating apparatus as in claim 9 wherein said means for driving said mask assembly from said spindle assembly includes a planetary gear coupled to the spindle assembly and a gear driven by the planetary gear and coupled to the mask assembly.

* * * * *